(12) United States Patent
Fazzio et al.

(10) Patent No.: US 8,188,810 B2
(45) Date of Patent: May 29, 2012

(54) ACOUSTIC RESONATOR PERFORMANCE ENHANCEMENT USING SELECTIVE METAL ETCH

(75) Inventors: Ronald S. Fazzio, Loveland, CO (US); Hongjun Feng, Austin, TX (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/838,657

(22) Filed: Jul. 19, 2010

(65) Prior Publication Data
US 2010/0277257 A1    Nov. 4, 2010

Related U.S. Application Data

(62) Division of application No. 11/021,085, filed on Dec. 22, 2004, now Pat. No. 7,791,434.

(51) Int. Cl.
*H03H 9/15* (2006.01)
*H03H 9/54* (2006.01)

(52) U.S. Cl. .......... 333/187; 333/189; 310/322; 310/326

(58) Field of Classification Search .......... 333/187–192; 310/312, 322, 324, 326, 335
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |

(Continued)

FOREIGN PATENT DOCUMENTS

DE    10160617    6/2003

(Continued)

OTHER PUBLICATIONS

U.S. Appl. No. 10/971,169, filed Oct. 22, 2004, Larson III, John D., et al.

(Continued)

*Primary Examiner* — Barbara Summons

(57) ABSTRACT

An acoustic resonator comprises: a substrate; a first electrode adjacent the substrate; a layer of piezoelectric material adjacent the first electrode; a second electrode adjacent the layer of piezoelectric material; and a passivation layer adjacent the layer of piezoelectric material. The passivation layer includes a recessed feature. Fill material is provided in the recessed feature of the passivation layer.

8 Claims, 6 Drawing Sheets

U.S. PATENT DOCUMENTS

| | | | |
|---|---|---|---|
| 4,798,990 A | 1/1989 | Henoch | |
| 4,819,215 A | 4/1989 | Yokoyama et al. | |
| 4,836,882 A | 6/1989 | Ballato | |
| 4,841,429 A | 6/1989 | McClanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,066,925 A | 11/1991 | Freitag | |
| 5,075,641 A | 12/1991 | Weber et al. | |
| 5,111,157 A | 5/1992 | Komiak | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,166,646 A | 11/1992 | Avanic et al. | |
| 5,185,589 A | 2/1993 | Krishnaswamy et al. | |
| 5,214,392 A | 5/1993 | Kobayashi et al. | |
| 5,233,259 A | 8/1993 | Krishnaswamy et al. | |
| 5,241,209 A | 8/1993 | Sasaki | |
| 5,241,456 A | 8/1993 | Marcinkiewicz et al. | |
| 5,262,347 A | 11/1993 | Sands | |
| 5,270,492 A | 12/1993 | Fukui | |
| 5,294,898 A | 3/1994 | Dworsky et al. | |
| 5,361,077 A | 11/1994 | Weber | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Bolorforosh | |
| 5,475,351 A | 12/1995 | Uematsu et al. | |
| 5,548,189 A | 8/1996 | Williams | |
| 5,567,334 A | 10/1996 | Baker et al. | |
| 5,587,620 A | 12/1996 | Ruby et al. | |
| 5,589,858 A | 12/1996 | Kadowaki et al. | |
| 5,594,705 A | 1/1997 | Connor et al. | |
| 5,603,324 A | 2/1997 | Oppelt et al. | |
| 5,633,574 A | 5/1997 | Sage | |
| 5,671,242 A | 9/1997 | Takiguchi et al. | |
| 5,692,279 A | 12/1997 | Mang et al. | |
| 5,704,037 A | 12/1997 | Chen | |
| 5,705,877 A | 1/1998 | Shimada | |
| 5,714,917 A | 2/1998 | Ella | |
| 5,729,008 A | 3/1998 | Blalock et al. | |
| 5,789,845 A | 8/1998 | Wadaka et al. | |
| 5,835,142 A | 11/1998 | Nakamura et al. | |
| 5,853,601 A | 12/1998 | Krishaswamy et al. | |
| 5,864,261 A | 1/1999 | Weber | |
| 5,866,969 A | 2/1999 | Shimada et al. | |
| 5,872,493 A | 2/1999 | Ella | |
| 5,873,153 A | 2/1999 | Ruby et al. | |
| 5,873,154 A | 2/1999 | Ylilammi et al. | |
| 5,894,184 A | 4/1999 | Furuhashi et al. | |
| 5,894,647 A | 4/1999 | Lakin | |
| 5,910,756 A | 6/1999 | Ella | |
| 5,932,953 A | 8/1999 | Drees et al. | |
| 5,936,150 A | 8/1999 | Kobrin et al. | |
| 5,953,479 A | 9/1999 | Zhou et al. | |
| 5,955,926 A | 9/1999 | Uda et al. | |
| 5,962,787 A | 10/1999 | Okada et al. | |
| 5,969,463 A | 10/1999 | Tomita | |
| 5,982,297 A | 11/1999 | Welle | |
| 6,001,664 A | 12/1999 | Swirhun et al. | |
| 6,016,052 A | 1/2000 | Vaughn | |
| 6,040,962 A | 3/2000 | Kanazawa et al. | |
| 6,051,907 A | 4/2000 | Ylilammi | |
| 6,060,818 A | 5/2000 | Ruby et al. | |
| 6,087,198 A | 7/2000 | Panasik | |
| 6,090,687 A | 7/2000 | Merchant et al. | |
| 6,107,721 A | 8/2000 | Lakin | |
| 6,111,341 A | 8/2000 | Hirama | |
| 6,111,480 A | 8/2000 | Iyama et al. | |
| 6,114,795 A * | 9/2000 | Tajima et al. | 310/312 |
| 6,118,181 A | 9/2000 | Merchant et al. | |
| 6,124,678 A | 9/2000 | Bishop et al. | |
| 6,124,756 A | 9/2000 | Yaklin et al. | |
| 6,131,256 A | 10/2000 | Dydyk et al. | |
| 6,150,703 A | 11/2000 | Cushman et al. | |
| 6,187,513 B1 | 2/2001 | Katakura | |
| 6,198,208 B1 | 3/2001 | Yano et al. | |
| 6,215,375 B1 | 4/2001 | Larson, III et al. | |
| 6,219,032 B1 | 4/2001 | Rosenberg et al. | |
| 6,219,263 B1 | 4/2001 | Wuidart | |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | |
| 6,263,735 B1 | 7/2001 | Nakatani et al. | |
| 6,265,246 B1 | 7/2001 | Ruby et al. | |
| 6,278,342 B1 | 8/2001 | Ella | |
| 6,284,121 B1 * | 9/2001 | Reid | 205/123 |
| 6,292,336 B1 | 9/2001 | Horng et al. | |
| 6,306,755 B1 * | 10/2001 | Zheng | 438/631 |
| 6,307,447 B1 | 10/2001 | Barber et al. | |
| 6,307,761 B1 | 10/2001 | Nakagawa | |
| 6,335,548 B1 | 1/2002 | Roberts et al. | |
| 6,355,498 B1 | 3/2002 | Chan et al. | |
| 6,366,006 B1 | 4/2002 | Boyd | |
| 6,376,280 B1 | 4/2002 | Ruby et al. | |
| 6,377,137 B1 | 4/2002 | Ruby | |
| 6,384,697 B1 | 5/2002 | Ruby | |
| 6,396,200 B2 | 5/2002 | Misu et al. | |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Shibata | |
| 6,441,539 B1 | 8/2002 | Kitamura et al. | |
| 6,441,702 B1 | 8/2002 | Ella et al. | |
| 6,462,631 B2 | 10/2002 | Bradley et al. | |
| 6,466,105 B1 | 10/2002 | Lobl et al. | |
| 6,466,418 B1 | 10/2002 | Horng et al. | |
| 6,469,597 B2 | 10/2002 | Ruby et al. | |
| 6,469,909 B2 | 10/2002 | Simmons | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Larson, III et al. | |
| 6,486,751 B1 | 11/2002 | Barber et al. | |
| 6,489,688 B1 | 12/2002 | Baumann et al. | |
| 6,492,883 B2 | 12/2002 | Liang et al. | |
| 6,496,085 B2 | 12/2002 | Ella et al. | |
| 6,498,604 B1 | 12/2002 | Jensen | |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,528,344 B2 | 3/2003 | Kang | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panasik | |
| 6,548,943 B2 | 4/2003 | Kaitila et al. | |
| 6,549,394 B1 | 4/2003 | Williams | |
| 6,550,664 B2 | 4/2003 | Bradley et al. | |
| 6,559,487 B1 | 5/2003 | Kang et al. | |
| 6,559,530 B2 | 5/2003 | Hinzel et al. | |
| 6,564,448 B1 | 5/2003 | Oura et al. | |
| 6,566,956 B2 | 5/2003 | Ohnishi et al. | |
| 6,566,979 B2 | 5/2003 | Larson, III et al. | |
| 6,580,159 B1 | 6/2003 | Fusaro et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,594,165 B2 | 7/2003 | Duerbaum et al. | |
| 6,600,390 B2 | 7/2003 | Frank | |
| 6,601,276 B2 | 8/2003 | Barber | |
| 6,603,182 B1 | 8/2003 | Low et al. | |
| 6,617,249 B2 | 9/2003 | Ruby et al. | |
| 6,617,750 B2 | 9/2003 | Dummermuth et al. | |
| 6,617,751 B2 | 9/2003 | Sunwoo et al. | |
| 6,621,137 B1 | 9/2003 | Ma et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson, III et al. | |
| 6,657,363 B1 | 12/2003 | Aigner | |

| | | |
|---|---|---|
| 6,668,618 B2 | 12/2003 | Larson, III et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 6,738,267 B1 | 5/2004 | Navas Sabater et al. |
| 6,750,593 B2 * | 6/2004 | Iwata ............................ 310/321 |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,148,466 B2 | 12/2006 | Eckman et al. |
| 7,158,659 B2 | 1/2007 | Baharav et al. |
| 7,161,448 B2 | 1/2007 | Feng et al. |
| 7,170,215 B2 | 1/2007 | Namba et al. |
| 7,173,504 B2 | 2/2007 | Larson, III et al. |
| 7,187,254 B2 | 3/2007 | Su et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,242,270 B2 | 7/2007 | Larson, III et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson, III et al. |
| 7,345,410 B2 | 3/2008 | Grannen et al. |
| 7,358,831 B2 | 4/2008 | Larson et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,385,467 B2 * | 6/2008 | Stoemmer et al. ............. 333/189 |
| 7,388,318 B2 | 6/2008 | Yamada et al. |
| 7,388,454 B2 | 6/2008 | Ruby et al. |
| 7,388,455 B2 | 6/2008 | Larson, III |
| 7,391,286 B2 | 6/2008 | Jamneala et al. |
| 7,400,217 B2 | 7/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson, III et al. |
| 7,425,787 B2 | 9/2008 | Larson, III |
| 7,439,824 B2 | 10/2008 | Aigner |
| 7,463,118 B2 | 12/2008 | Jacobsen |
| 7,466,213 B2 | 12/2008 | Lobl et al. |
| 7,482,737 B2 | 1/2009 | Yamada et al. |
| 7,508,286 B2 | 3/2009 | Ruby et al. |
| 7,515,018 B2 | 4/2009 | Handtmann et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,576,471 B1 | 8/2009 | Solal |
| 7,602,101 B2 | 10/2009 | Hara et al. |
| 7,619,493 B2 | 11/2009 | Uno et al. |
| 7,629,865 B2 | 12/2009 | Ruby |
| 7,655,963 B2 | 2/2010 | Sadaka et al. |
| 7,684,109 B2 | 3/2010 | Godshalk et al. |
| 7,758,979 B2 | 7/2010 | Akiyama et al. |
| 7,768,364 B2 | 8/2010 | Hart et al. |
| 7,791,434 B2 | 9/2010 | Fazzio et al. |
| 7,795,781 B2 | 9/2010 | Barber et al. |
| 7,889,024 B2 | 2/2011 | Bradley et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |

| Publication No. | Date | Inventor |
|---|---|---|
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0246075 A1* | 12/2004 | Bradley et al. ........ 333/187 |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng |
| 2006/0017352 A1 | 1/2006 | Tanielian |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0164186 A1* | 7/2006 | Stoemmer et al. ........ 333/189 |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2007/0291164 A1 | 12/2007 | Goh et al. |
| 2008/0055020 A1 | 3/2008 | Handtmann et al. |
| 2008/0143215 A1 | 6/2008 | Hara et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0064498 A1 | 3/2009 | Mok et al. |
| 2009/0079302 A1 | 3/2009 | Wall et al. |
| 2009/0096550 A1 | 4/2009 | Handtmann et al. |
| 2009/0127978 A1 | 5/2009 | Asai et al. |
| 2009/0153268 A1 | 6/2009 | Milson et al. |
| 2009/0201594 A1 | 8/2009 | Smith |
| 2010/0013573 A1 | 1/2010 | Umeda |
| 2010/0052176 A1 | 3/2010 | Kamada et al. |
| 2010/0052815 A1 | 3/2010 | Bradley et al. |
| 2010/0091370 A1 | 4/2010 | Mahrt et al. |
| 2010/0102358 A1 | 4/2010 | Lanzieri et al. |
| 2010/0148637 A1 | 6/2010 | Satou |
| 2010/0176899 A1 | 7/2010 | Schaufele et al. |
| 2010/0187948 A1 | 7/2010 | Sinha et al. |
| 2010/0187949 A1 | 7/2010 | Pahl et al. |
| 2010/0260453 A1 | 10/2010 | Block |
| 2010/0327697 A1 | 12/2010 | Choy et al. |
| 2010/0327994 A1 | 12/2010 | Choy et al. |
| 2011/0121689 A1 | 5/2011 | Grannen et al. |
| 2011/0180391 A1 | 7/2011 | Larson et al. |
| 2011/0204997 A1 | 8/2011 | Elbrecht et al. |

FOREIGN PATENT DOCUMENTS

| | | |
|---|---|---|
| DE | 102 39 317 A1 * | 3/2004 |
| EP | 231892 | 8/1987 |
| EP | 0637875 | 2/1995 |
| EP | 689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299593 | 3/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 62-109419 | 5/1987 |
| JP | 62-200813 | 9/1987 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 2000-31552 | 1/2000 |
| JP | 2000-076295 | 3/2000 |
| JP | 2000-232334 | 8/2000 |
| JP | 2000-295065 | 10/2000 |
| JP | 2000-332568 | 11/2000 |
| JP | 2001-102901 | 4/2001 |
| JP | 2001-508630 | 6/2001 |
| JP | 2002/217676 | 8/2002 |
| JP | 2002217676 | 8/2002 |
| JP | 2003/017964 | 1/2003 |
| JP | 2003-17974 | 1/2003 |
| JP | 2003-505905 | 2/2003 |
| JP | 2003/124779 | 4/2003 |
| JP | 2003124779 | 4/2003 |
| JP | 2003-332872 | 11/2003 |
| JP | 2006-109472 | 4/2006 |

| | | |
|---|---|---|
| JP | 2006-295924 | 10/2006 |
| JP | 2006-319796 | 11/2006 |
| JP | 2007-006501 | 1/2007 |
| JP | 2007/028669 | 2/2007 |
| JP | 2007-295306 | 11/2007 |
| WO | WO-98/16957 | 4/1998 |
| WO | WO-98/38736 | 9/1998 |
| WO | WO-98/56049 | 12/1998 |
| WO | WO-99/37023 | 7/1999 |
| WO | WO-01/06646 | 1/2001 |
| WO | WO-01/06647 | 1/2001 |
| WO | WO-0199276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

Al-Ahmad, M. et al., "Piezoelectric-Based Tunable Microstrip Shunt Resonator", *Proceedings of Asia-Pacific Microwave Conference* 2006.

Aoyama, Takayuki et al., "Diffusion of Boron, Phosphorous, Arsenic and Antimony in Thermally Grown SiliconDioxide", *Journal of the Electrochemical Society*, vol. 146, No. 5 1999, 1879-1883.

Auld, B. A., "Acoustic Resonators", *Acoustic Fields and Waves in Solids, Second Edition*, vol. II 1990, 250-259.

Bauer, L. O. et al., "Properties of Silicon Implanted with Boron Ions through Thermal Silicon Dioxide", *Solid State Electronics*, vol. 16, No. 3 Mar. 1973, 289-300.

Choi, Sungjin et al., "Design of Half-Bridge Piezo-Transformer Converters in the AC Adapter Applications", *APEC 2005*, IEEE Mar. 2005, 244-248.

Coombs, Clyde F., "Electronic Instrument Handbook", *Second Edition, McGraw-Hill, Inc*, 1995, pp. 5.1 to 5.29.

Fattinger, G. G. et al., "Coupled Bulk Acoustic Wave Resonator Filters: Key technology for single-to-balanced RF filters", 0-7803-8331-1/4/W20.00; *IEEE MTT-S Digest* 2004, 927-929.

Hadimioglu, B. et al., "Polymer Films As Acoustic Matching Layers"., *1990 IEEE Ultrasonics Symposium Proceedings*, vol. 3 PP. [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007 Dec. 1990, 1337-1340.

Hara, K., "Surface Treatment of Quartz Oscillator Plate by Ion Implantation", Oyo Buturi, vol. 47, No. 2 Feb. 1978, 145-146.

Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.

Jiang, Yimin et al., "A Novel Single-Phase Power Factor Correction Scheme", *IEEE* 1993, 287-292.

Jung, Jun-Phil et al., "Experimental and Theoretical Investigation on the Relationship Between AIN Properties and AIN-Based FBAR Characteristics", *2003 IEEE International Frequency Control Symposium and PDA Exhibition Jointly with the 17th European Frequency and Time Forum* Sep. 3, 2003, 779-784.

Krishnaswamy, S.V. et al., "Film Bulk Acoustic Wave Resonator Technology", May 29, 1990, 529-536.

Lakin, K.M., "Bulk Acoustic Wave Coupled Resonator Filters", *2002 IEEE International Frequency Control Symposium and PDA Exhibition* May 2002, 8-14.

Lakin, K.M., "Coupled Resonator Filters", *2002 IEEE Ultrasonics Symposium* Mar. 2, 2002, 901-908.

Lakin, K.M. et al., "High Performance Stacked Crystal Filters for GPS and Wide Bandwidth Applications", *2001 IEEE Ultrasonics Symposium* Jan. 1, 2001, 833-838.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K.M., "Thin Film BAW Filters for Wide Bandwidth and High Performance Applications", *IEEE Microwave Symposium Digest*; vol. 2 Jun. 6-11, 2004, 923-926.

Lakin, K. M., "Thin Film Resonators and Filters", *IEEE Untrasonics Symposium*, Caesar's Tahoe, NV Oct. 1999, 895-906.

Lakin, et al., "Wide Bandwidth Thin Film BAW Filters", *2004 IEEE Ultrasonics Symposium*, vol. 1, Aug. 2004, 407-410.

Larson III, John D. et al., "Measurement of Effective Kt2,Q,Rp,Rs vs. Temperature for Mo/AIN FBAR Resonators", *IEEE Ultrasonics Symposium* 2002, 939-943.

Li, Yunxiu et al., "AC-DC Converter with Worldwide Range Input Voltage by Series and Parallel Piezoelectric Transformer Connection", *35th Annual IEEE Power Electronics Specialists Conference* 2004.

Lobl, H.P. et al., "Piezoelectric Materials for BAW Resonators and Filters", *2001 IEEE Ultrasonics Symposium* Jan. 1, 2001, 807-811.

Martin, Steven J. et al., "Development of a Low Dielectric Constant Polymer for the Fabrication of Integrated Circuit Interconnect", *12 Advanced Materials* Dec. 23, 2000, 1769-1778.

Merriam-Webster, , "Collegiate Dictionary", *tenth edition* 2000, 2 pages.

Navas, J. et al., "Miniaturized Battery Charger using Piezoelectric Transformers", *IEEE* 2001, 492-496.

Ng, J. et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pang, W, et al., "High Q Single-Mode High-Tone Bulk Acoustic Resonator Integrated With Surface-Machined FBAR Filter", *Microwave Symposium Digest, IEEE MTT-S International* 2005, 413-416.

Parker, T. E. et al., "Temperature-Compensated Surface Acoustic-Wave Devices with SiO2 Film Overlays", *J. Appl. Physics*, vol. 50 1360-1369, Mar. 1979.

Reinhardt, Alexandre et al., "Design of Coupled Resonator Filters Using Admittance and Scattering Matrices", *2003 IEEE Ultrasonics Symposium* May 3, 2003, 1428-1431.

Ruby, R. C., "MicroMachined Thin Film Bulk Acoustic Resonators", *IEEE International Frequency Control Symposium* 1994, 135-138.

Ruby, R. et al., "The Effect of Perimeter Geometry on FBAR Resonator Electrical Performance", *Microwave Symposium Digest, 2005 IEEE MTT-S International* Jun. 12, 2005, 217-221.

Sanchez, A.M. et al., "Mixed Analytical and Numerical Design Method for Piezoelectric Transformers", *IEEE Xplore* 2003, 841-846.

Schuessler, Hans H., "Ceramic Filters and Resonators", *Reprinted from IEEE Trans. Sonics Ultrason.*, vol. SU-21 Oct. 1974, 257-268.

Spangenberg, B. et al., "Dependence of the Layer Resistance of Boron Implantation in Silicon and the Annealing Conditions", *Comptus Rendus de l'Academic Bulgare des Sciences*, vol. 33. No. 3 1980, 325-327.

Tiersten, H. F. et al., "An Analysis of Thickness-Extensional Trapped Energy Resonant Device Structures with Rectangular Electrodes in the Piezoelectric Thin Film on Silicon Configuration", *J. Appl. Phys.* 54 (10) Oct. 1983, 5893-5910.

Topich, J. A. at al., "Effects of Ion Implanted Flourine in Silicon Dioxide", *Nuclear Instr. And Methods Cecon Rec*, Cleveland, OH May 1978, 70-73.

Tsubbouchi, K. at al., "Zero Temperature coefficient Surface Acoustic Wave Devices using Epitaxial AIN Films", *IEEE Ultrasonic symposium*, San Diaego, CA, 1082 1982, 240-245.

Vasic, D et al., "A New Method to Design Piezoelectic Transformer Used in MOSFET & IGBT Drive Circuits", *IEEE 34th Annual Power Electronics Specialists Conference*, 2003 vol. 1 Jun. 15-19, 2003 , 307-312.

Vasic, D et al., "A New MOSFET & IGBT Gate Drive Insulated by a Piezoelectric Transformer", *IEEE 32nd Annual Power Electronics Specialists Conference*, 2001 vol. 3 2001 , 1479-1484.

Yang, C.M. at al., "Highly C Axis Oriented AlN Film Using MOCVD for 5GHx Band FBAR Filter", *2003 IEEE Ultrasonics Symposium* Oct. 5, 2003 , pp. 170-173.

Akiyama, et al., "Enhancement of Piezoelectric Response in Scandium Aluminum Nitride Alloy Thin Films Prepared by Dual Reactive Cosputtering", *Adv. Mater* 2009 , 593-596.

Bi, F.Z. , "Bulk Acoustic Wave RF Technology", *IEEE Microwave Magazine*, vol. 9, Issue 5. 2008 , 65-80.

Chen, , "Fabrication and Characterization of ALN Thin Film Bulk Acoustic Wave Resonator", *Dissertation, University of Pittsburgh School of Engineering* 2006.

C-S Lee, et al., "Copper-Airbridged Low-Noise GaAs PHEMT With Ti/WN$_x$/Ti Diffusion Barrier for High-Frequency", *IEEE Transactions on Electron Devices*, vol. 53 , Issue: 8. 2006 , 1753-1758.

Denisse, C.M.M. et al., "Plasma-Enhanced Growth and Composition of Silicon Oxynitride Films", *J. Appl. Phys.*, vol. 60 No. 7. Oct. 1, 1986 , 2536-2542.

Fattinger, G.G. et al., "Single-To-Balance Filters for Mobile Phones Using Coupled Resonator BAW Technology", *2004 IEEE Ultrasonics Symposium* Aug. 2004 , 416-419.

Fattinger, G. B. et al "Spurious Mode Suppression in Coupled Resonator Filters", *IEEE MTT-S International Microwave Symposium Digest* 2005 , 409-412.

Gilbert, S. R. , "An Ultra-Miniature, Low Cost Single Ended to Differential Filter for ISM Band Applications", *Micro. Symp. Digest, 2008 IEEE MTT-S* Jun. 2008 , 839-842.

Grill, A. et al., "Ultralow-K Dielectrics Prepared by Plasma-Enhanced Chemical Vapor Deposition", *App. Phys. Lett*, vol. 79 2001 , 803-805.

Jamneala, T. et al., "Coupled Resonator Filter with Single-Layer Acoustic Coupler", *IEEE Transaction on Ultrasonics, Ferroelectrics, and Frequency Control*, vol. 55 Oct. 2008 , 2320-2326.

Jamneala, Tiberiu et al., "Ultra-Miniature Coupled Resonator Filter with Single-Layer Acoustic Coupler", *IEEE Transactions on Ultrasonics, Ferroelectrics, and Frequency Control*, vol. 56, No. 11. Nov. 2009 , 2553-2558.

Kaitila, J. et al, "Measurement of Acoustical Parameters of Thin Films", *2006 IEEE Ultrasonics Symposium* Oct. 2006 , 464-467.

Lee, Jiunn-Homg et al,, "Optimization of Frame-Like Film Bulk Acoustic Resonators for Suppression of Spurious Lateral Modes Using Finite Element Method", *IEEE Ultrasonic Symposium* vol. 1 2004 , 278-281.

Loboda, M. J. , "New Solutions for Intermetal Dielectrics Using Trimethylsilane-Based PECVD Processes" *Microelectronics Eng.*, vol. 50. 2000 , 15-23.

Martin, et al., "Re-growth of C-Axis Oriented AlN Thin Films", *IEEE Ultrasonics Symposium* 2006 , 169-172.

Martin, et al., "Shear Mode Coupling and Tilted Gram Growth of AlN Thin Films in BAW Resonators", *IEEE Transactions on Ultrasonics, Ferroelectrics, and Frequency Control*, vol. 53, No. 7 Jul. 2006 , 1339-1343.

Martinez, et al, "High confinement suspended micro-ring resonators in silicon-on-insulator", *Optics Express*, Vo. 14, No. 13 Jun. 26, 2006 , 6259-6263.

Pandey, et al., "Anchor Loss Reduction in Resonant MEMS using MESA Structures", *Proceedings of the 2nd IEEE International Conference on Nano/Micro Engineered and Molecular Systems*, Bangkok, Thailand Jan. 16-19, 2007 , 880-885.

Pensala, et al., "Spurious resonance supression in gigahertz-range ZnO thin-film bulk acoustic wave resonators by the boundary frame method: modeling and experiment", *IEEE Transactions on Ultrasonics, Ferroelectrics, and Frequency Control*, vol. 56; No. 8 Aug. 2009 , 1731-1744.

Pensala "Thin film bulk acoustic wave devices: performance optimization and modeling", http://www.vtt.fi/inf/pdf/publications/2011/P756.pdf, presented Feb. 25, 2011.

Schoenholz, J.E. et al., "Plasma-Enhanced Deposition of Silicon Oxynitride Films", *Thin Solid Films* 1987 , 285-291.

Shirakawa, A. A. et al., "Bulk Acoustic Wave Coupled Resonator Filters Synthesis Methodology", *2005 European Microwave Conference*, vol. 1 Oct. 2005.

Small, M. K. et al, "A De-Coupled Stacked Bulk Acoustic Resonator (DSBAR) Filter with 2 dB Bandwidth >4%", *2007 IEEE Ultrasonics Symposium* Oct. 2007 , 604-607.

Tas, et al., "Reducing Anchor Loss in Micromechanical Extensional Mode Resonators", *IEEE Transactions on Ultrasonics, Ferroelectrics and Frequency Control* vol. 57 No. 2. Feb. 2010 , 448-454.

Thomsen, C. et al., "Surface Generation and Detection of Phonons by Picosecond Light Pulses", *Phys. Rev. B*, vol. 34 1986 , 4129.

Yanagitani, et al., "Giant Shear Mode Electromechanical Coupling Coefficient k15 in C-Axis Tilted ScAlN Films", *IEEE International Ultrasonics Symposium* 2010.

"Co-pending U.S. Appl. No. 13/161,946, filed Jun. 16, 2011".

\* cited by examiner

ACOUSTIC RESONATOR PERFORMANCE ENHANCEMENT USING SELECTIVE METAL ETCH

CROSS-REFERENCE TO RELATED APPLICATIONS

This patent application is related to U.S. patent application Ser. No. 10/867,540, filed on Jun. 14, 2004, entitled "ACOUSTIC RESONATOR PERFORMANCE ENHANCEMENT USING RECESSED REGION," now U.S. Pat. No. 7,161,488 is commonly assigned to the same assignee as the present invention. This patent application is a divisional patent application of and claims priority from U.S. patent application Ser. No. 11/021,085 (now U.S. Pat. No. 7,791,434), filed on Dec. 22, 2004. This patent application is assigned to the same assignee as U.S. Pat. No. 7,791,434.

BACKGROUND

The need to reduce the cost and size of electronic equipment has created a need for smaller single filtering elements. Thin-Film Bulk Acoustic Resonators (FBARs) and Stacked Thin-Film Bulk Wave Acoustic Resonators (SBARs) represent one class of filter elements with potential for meeting these needs. These filters can collectively be referred to as FBARs. An FBAR is an acoustic resonator that uses bulk longitudinal acoustic waves in thin-film piezoelectric (PZ) material. Typically, an FBAR includes a layer of PZ material sandwiched between two metal electrodes. The combination PZ material and electrodes are suspended in air by supporting the combination around its perimeter or are placed over an acoustic mirror.

When an electrical field is created between the two electrodes, the PZ material converts some of the electrical energy into mechanical energy in the form of acoustic waves. The acoustic waves propagate in the same direction as the electric field and reflect off the electrode-air or electrode-acoustic mirror interface at some frequency, including at a resonance frequency. At the resonance frequency, the device can be used as an electronic resonator. Multiple FBARs can be combined such that each are elements in RF filters.

Ideally, the resonant energy in the filter elements is entirely "trapped" in the resonator. In practice, however, dispersive modes exist. These modes can result in a decreased quality factor (Q) for the filter.

For these and other reasons, a need exists for the present invention.

SUMMARY

One aspect of the present invention provides an acoustic resonator that includes a substrate, a first electrode, a layer of piezoelectric material, and a second electrode. The substrate has a first surface and the first electrode is adjacent the first surface of the substrate. The layer of piezoelectric material is adjacent the first electrode. The second electrode is adjacent the layer of piezoelectric material, and the second electrode lies in a first plane and has an edge. The layer of piezoelectric material has a recessed feature adjacent the edge of the second electrode.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
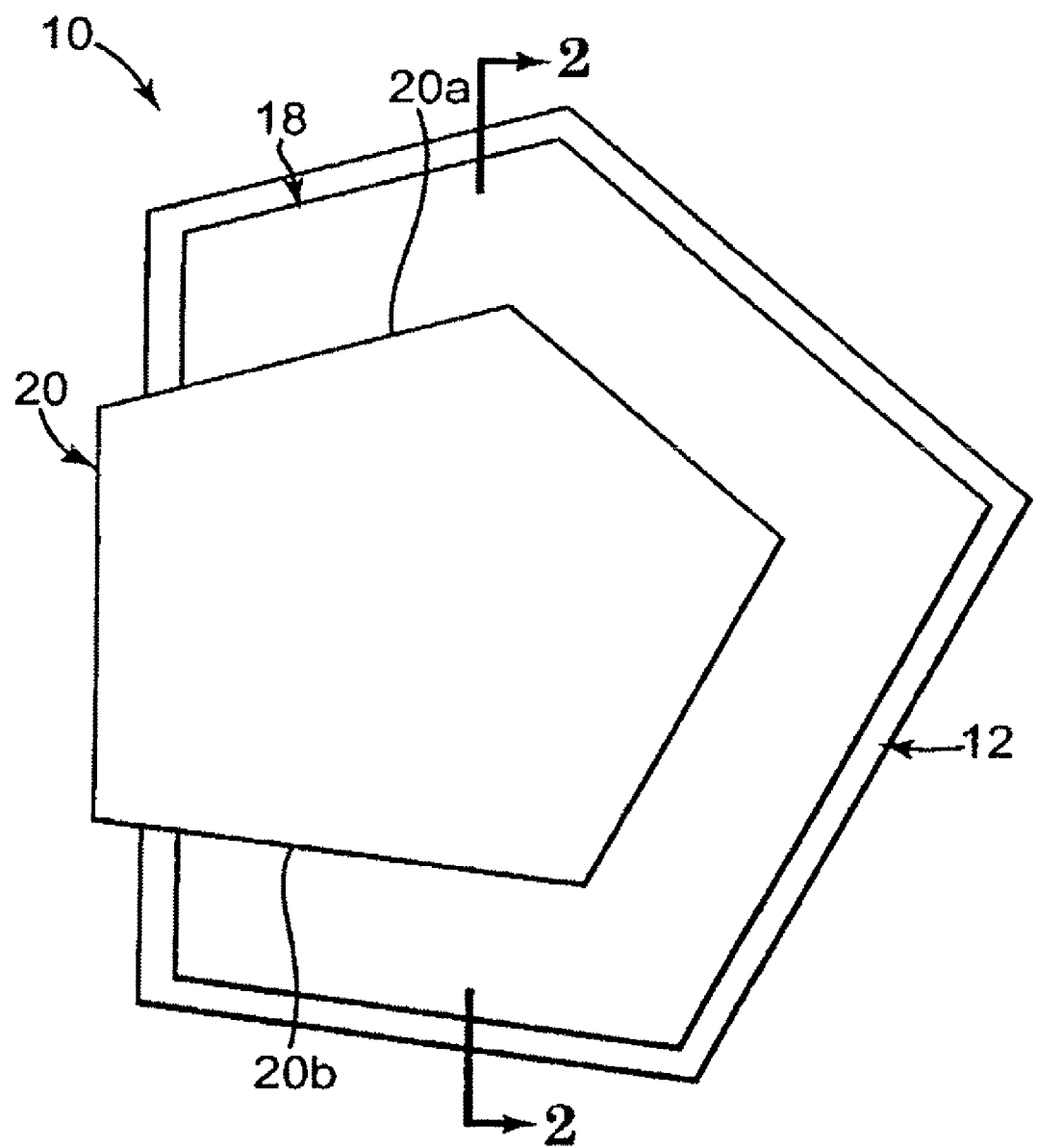
FIG. 1 illustrates a top plan view of an FBAR.
Figure 2:
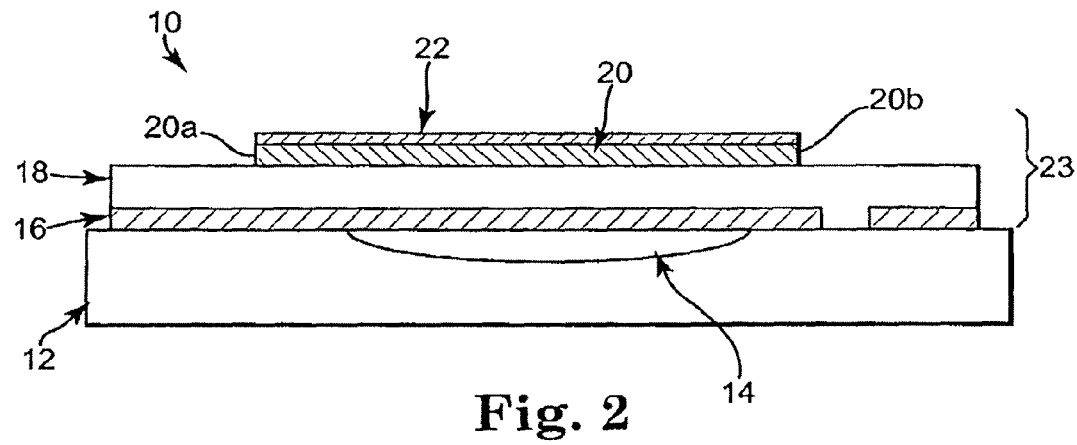
FIG. 2 illustrates a cross-sectional view of an FBAR.

FIGS. 1 and 2 illustrate top and cross-sectional views, respectively, of FBAR 10. FBAR 10 includes substrate 12, depression 14, first electrode 16, piezoelectric (PZ) layer 18, second electrode 20, and passivation layer 22. In FIG. 1, passivation layer 22 has been removed, and first electrode 16 and depression 14 are hidden from view. Second electrode 20 has a perimeter that is illustrated in FIG. 1 as pentagon-shaped. Typically, contacts are coupled to first electrode 16 and to second electrode 20. These contacts facilitate connecting the first and second electrodes 16 and 20 to a source of voltage. Two locations along that perimeter, first edge 20a and second edge 20b, are illustrated in the plan view of FIG. 1 and the cross-sectional view of FIG. 2.

First electrode 16, PZ layer 18, second electrode 20, and passivation layer 22 collectively form FBAR membrane 23. FBAR membrane 23 is adjacent substrate 12 and suspended over depression 14 to provide an electrode-air interface. In one embodiment, depression 14 is created by etching away a portion of substrate 12. Depression 14 is deep enough so that sufficient electrode-air interface is created under FBAR membrane 23.

In an alternative embodiment, FBAR membrane 23 may be placed adjacent an acoustic mirror (not illustrated in FIGS. 1 and 2) formed within substrate 12. In this way, an electrode-acoustic mirror interface is formed. The resonator thus formed is a Solid Mounted Resonator (SMR).

In one embodiment, substrate 12 is made of silicon (Si) and PZ layer 18 is made from aluminum nitride (AlN). Alternatively, other piezoelectric materials may be used for PZ layer 18. In one embodiment, first and second electrode 16 and 20 may be made of molybdenum (Mo). Alternatively, other materials may be used for the electrodes. In one embodiment, the contacts may be made of gold (Au). Alternatively, other materials may be used for the contacts.

FBAR 10 illustrated in FIGS. 1 and 2 is configured to use bulk compression or sheer acoustic waves propagating in PZ layer 18. When an electric field is created between first and second electrodes 16 and 20 via an impressed voltage, the piezoelectric material of PZ layer 18 converts some of the electrical energy into mechanical energy in the form of acoustic waves. So configured, FBAR 10 exhibits dispersive modes resulting in a quality factor (Q) loss for FBAR 10.

Figure 3:
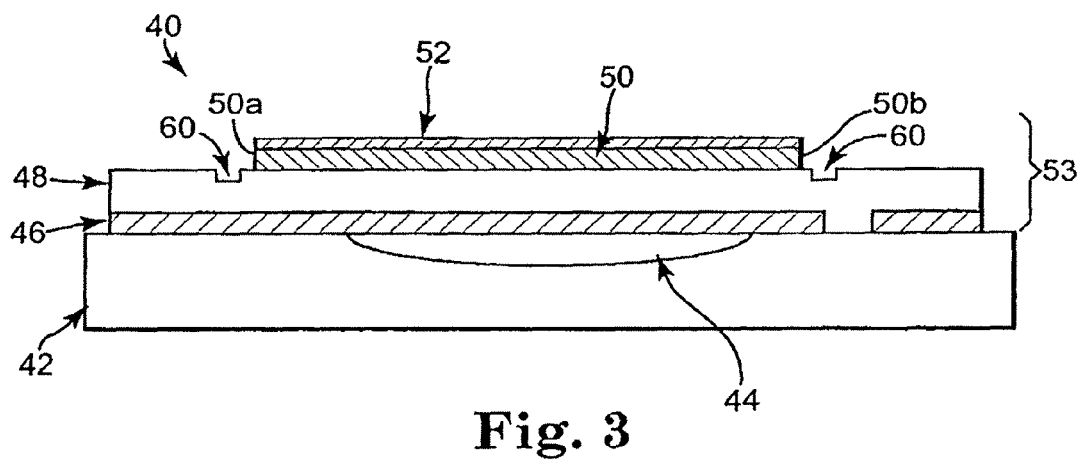
FIG. 3 illustrates a cross-sectional view of an FBAR according to one embodiment of the present invention.

FIG. 3 illustrates a cross-sectional view of FBAR 40 in accordance with one embodiment of the present invention. FBAR 40 includes substrate 42, depression 44, first electrode 46, piezoelectric (PZ) layer 48, second electrode 50, and passivation layer 52. Typically, contacts (not illustrated in FIG. 3) are coupled to first and second electrodes 46 and electrode 50. The contacts facilitate connecting first and second electrodes 46 and 50 to a voltage source. First electrode 46, PZ layer 48, second electrode 50, and passivation layer 52 collectively form FBAR membrane 53, which may be placed over a depression 44 or over an acoustic mirror as discussed above. FBAR membrane 53 is illustrated adjacent substrate 42 and suspended over depression 44 to provide an electrode-air interface. As with previous embodiments, an electrode-acoustic mirror interface is also obtainable using an SMR design in accordance with the present invention.

Second electrode 50 and passivation layer 52 have a perimeter that can be of various configurations. For example, the perimeters of each can be pentagon-shaped, similar to FBAR 10 above. They could also be any of various polygonal shapes, circular, or various irregular shapes. The cross-sectional view illustrated in FIG. 3 illustrates two locations along the perimeter of second electrode 50, first and second edges 50a and 50b. In one embodiment, edges of passivation layer 52 are generally aligned with those of second electrode 50 in the vertical direction as FBAR 40 is illustrated in FIG. 3.

In FBAR 40 illustrated in FIG. 3, a recessed feature 60 has been selectively etched into PZ layer 48 adjacent the first and second edges 50a and 50b of second electrode 50. When first and second edges 50a and 50b of second electrode 50 are considered to be vertical (as oriented in the illustration of FIG. 3), recessed feature 60 is "outside" the first and second edges 50a and 50b of second electrode 50 in the horizontal direction. (For comparison, depression 44 would be considered "inside" the first and second edges 50a and 50b of second electrode 50 in the horizontal direction.

Recessed feature 60 improves the performance of FBAR 40, resulting in improved insertion loss and improved resonator quality factor Q of FBAR 40. The overall quality factor Q of FBAR 40 depends proportionally on a parameter of resistance called $R_p$. In FBAR 40, the $R_p$ may be improved by recessed feature 60.

An electric field is created between first and second electrodes 46 and 50 via an impressed voltage. The piezoelectric material of PZ layer 18 converts some of the electrical energy into mechanical energy in the form of acoustic waves. Some of the acoustic waves in FBAR 40 are longitudinally-directed acoustic waves of any mode type, while others are referred to transversely-directed acoustic waves of the compression, or sheer-mode type. FBAR 40 is designed to use bulk compression or sheer acoustic waves propagating in a longitudinal direction in the PZ layer 48 as the desired resonator mode. However, FBAR 40, which provides recessed feature 60, reduces or suppresses energy loss, thereby improving the Q of the filter. Recessed feature 60 may also help suppress noise in the filter.

Recessed feature 60 may have a depth in PZ layer 48 that is on the order of hundreds to thousands of angstroms, and may have a width on the order of fractions of a micron to microns or even larger, up to the width of PZ layer 48 that extends beyond first and second edges 50a and 50b of second electrode 50. In one embodiment, PZ layer 48 is selectively etched to form recessed feature 60 that is fraction of a micron to microns to 10's of microns wide by 100's to 1000's angstroms deep. Also in one case, recessed feature 60 is offset from first and second edges 50a and 50b of second electrode 50 by fractions of a micron to microns. In other words, recessed feature 60 is outside first and second edges 50a and 50b of second electrode 50 by fractions of a micron to microns.

Figure 4:
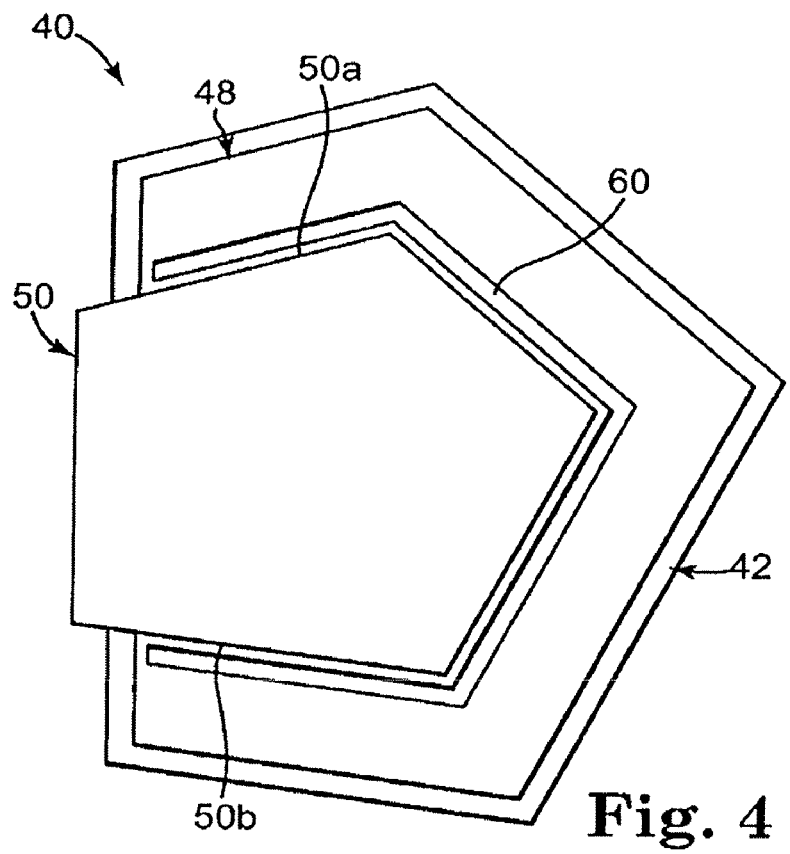
FIG. 4 illustrates a top plan view of one embodiment of the FBAR illustrated in FIG. 3.
Figure 5:
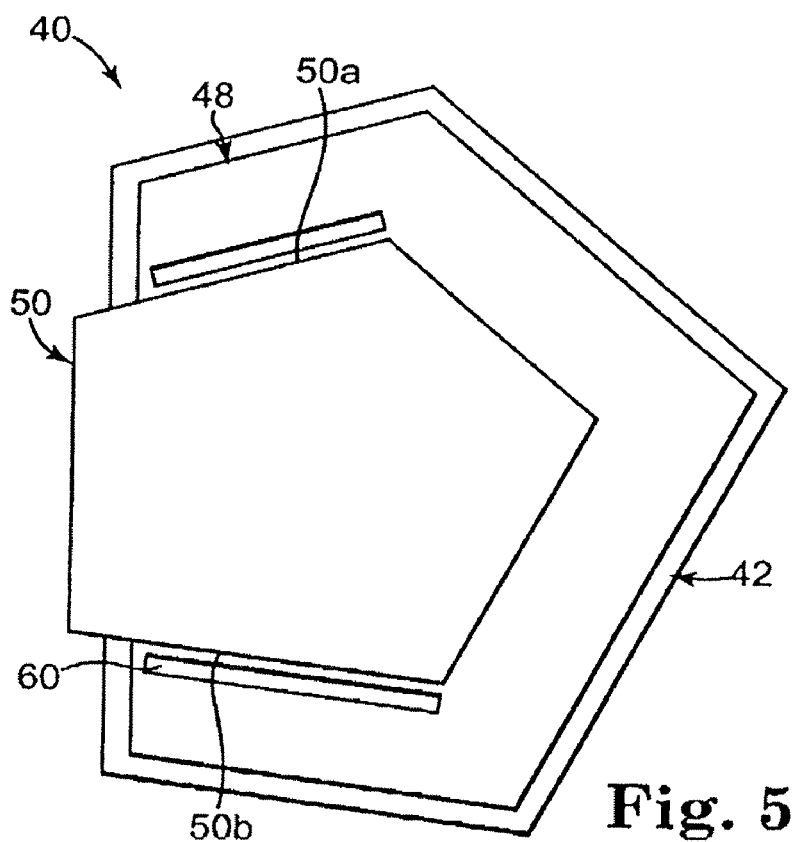
FIG. 5 illustrates a top plan view of an alternative embodiment of the FBAR illustrated in FIG. 3.

FIGS. 4 and 5 illustrate plan views of FBAR 40 of FIG. 3 in accordance with alternative embodiments of the present invention. As illustrated in FIGS. 4 and 5, FBAR 40 includes substrate 42, piezoelectric (PZ) layer 48, second electrode 50. In FIGS. 4 and 5, passivation layer 52 has been removed, and first electrode 46 and depression 44 are hidden from view. Typically, contacts (not illustrated in the Figures) are coupled to first and second electrodes 46 and electrode 50.

In FIGS. 4 and 5, recessed feature 60 is illustrated extending adjacent the perimeter of second electrode 50. In the Figures, the perimeter of second electrode 50 is generally pentagon-shaped having five relatively straight edges, but may also be polygonal in shape, circular in shape, or have any other smooth or irregular shape. In FIG. 4, recessed feature 60 is illustrated extending adjacent and outside the perimeter of second electrode 50 along four of the five edges of the pentagon-shaped electrode. Since a contact would typically be attached to the fifth edge of the electrode (labeled 50a), recessed feature 60 does not extend along that edge. FIG. 5 illustrates an alternative embodiment of FBAR 40 where recessed feature 60 extends adjacent the perimeter of second electrode 50 along two of the five edges of the pentagon-shaped electrode.

As one skilled in the art will understand, any number of alternative recessed feature 60 may be provided adjacent the edges of second electrode 50 consistent with the present invention. Recessed feature 60 may be continuously extending along some or all of the edges of second electrode 50 as illustrated, the recessed feature 60 may have smaller segments that are not continuous along the edge, and other shapes and configurations of recessed feature 60 may be used, especially where second electrode 50 is a shape other than a pentagon.

Figure 6:
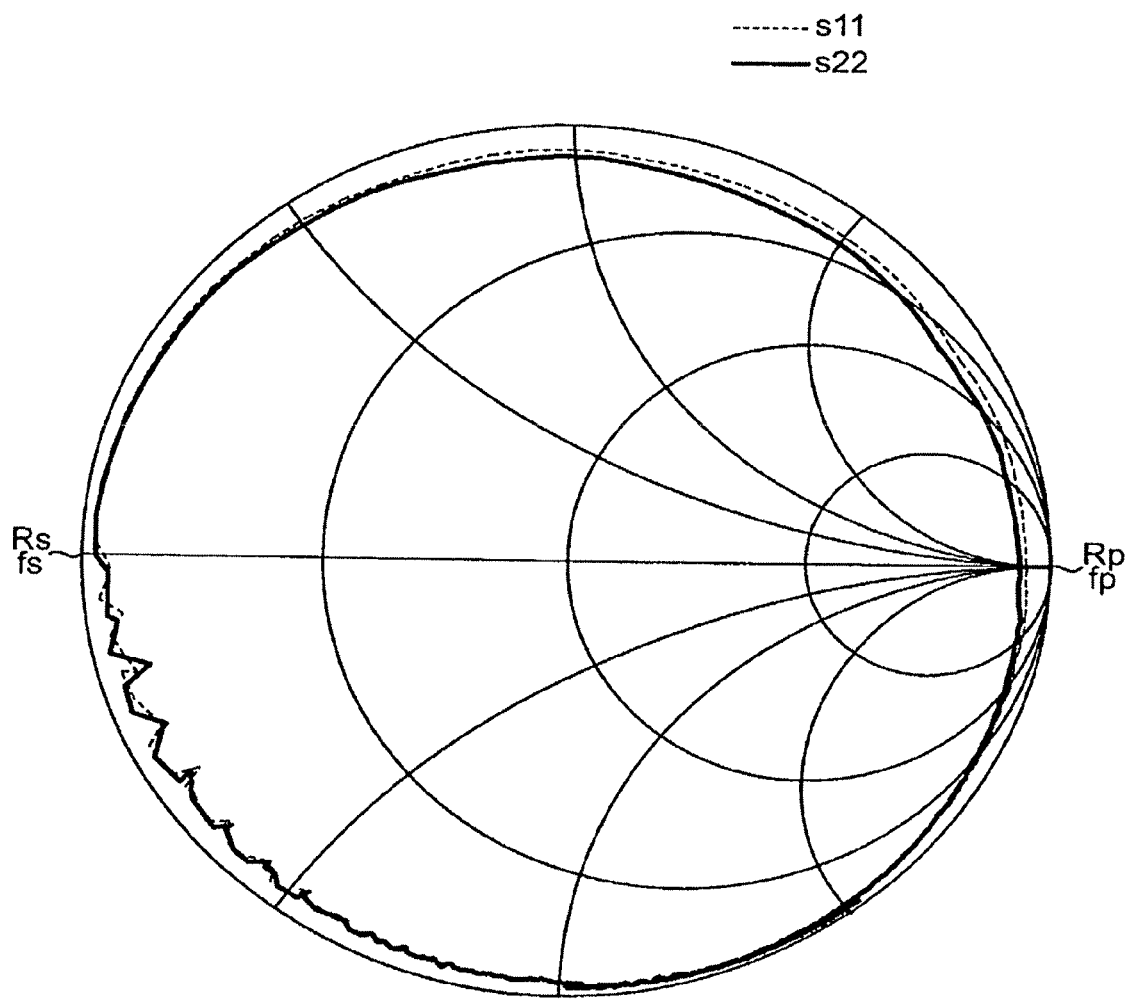
FIG. 6 illustrates Q circles for two exemplary FBARs plotted on a Smith chart.

FIG. 6 illustrates Q circles for two exemplary FBARs plotted on a Smith chart, and illustrates improvement in $R_p$ and therefore Q in one of the FBARs. As is known in the art, a Smith Chart is a polar plot of a complex impedance (used in the following to show measures of s11 and s22 scattering parameters). These s11 and s22 scattering parameters represent a ratio of complex amplitudes of backward and forward waves. The Smith Chart aids in translating the reflection coefficients into impedance and it maps part of the impedance placed into a unit circle.

The improved performance of FBAR 40 is demonstrated by the Q circles illustrated in FIG. 6. FIG. 6 illustrates the S-parameter measurements of an exemplary etched device, such as FBAR 40 with recessed feature 60 having exemplary measurements in one case that are 14.5 μm wide by 3000 Å deep and offset from second electrode 50 by 0.5 μm. As illustrated, etched device (dashed line labeled S11) has a much improved $R_p$ versus that of a control device (solid line labeled S22).

Generally, the horizontal axis passing through the unit circle represents real impedance, the area above the axis represents inductive reactance and the area below represents capacitive reactance. The left-hand portion of the chart at zero reactance represents series resonance frequency (fs) and occurs where the Q circle crosses the real axes on the left side of the Smith Chart. The left-hand portion of the chart also demonstrates the parameter of resistance $R_s$. The right-hand portion of the chart at zero reactance represents parallel resonant frequency (fp) and occurs where the Q circle crosses the real axes on the right side the Smith Chart. The right-hand portion of the chart also demonstrates the parameter of resistance $R_p$. The closer that a plot of FBAR filter characteristics on a Smith Chart is to the perimeter of the Smith Chart, the higher the Q will be for that FBAR. Also, the more smooth that the curve is, the lower the noise is in the FBAR.

In FIG. 6, the performance of FBAR 40 as a filter is illustrated by dashed line Q circle s11 and the performance of a prior art FBAR without a recessed region is illustrated by solid line Q circle s22. As evident, FBAR 40 improves the quality of the filter near the resistance $R_p$. FBAR 40, illustrated by Q circle s11, more closely approximates a circle and is representative of a lower noise and less lossy device, which improves the performance of FBAR 40 when used in a filter.

Figure 7:
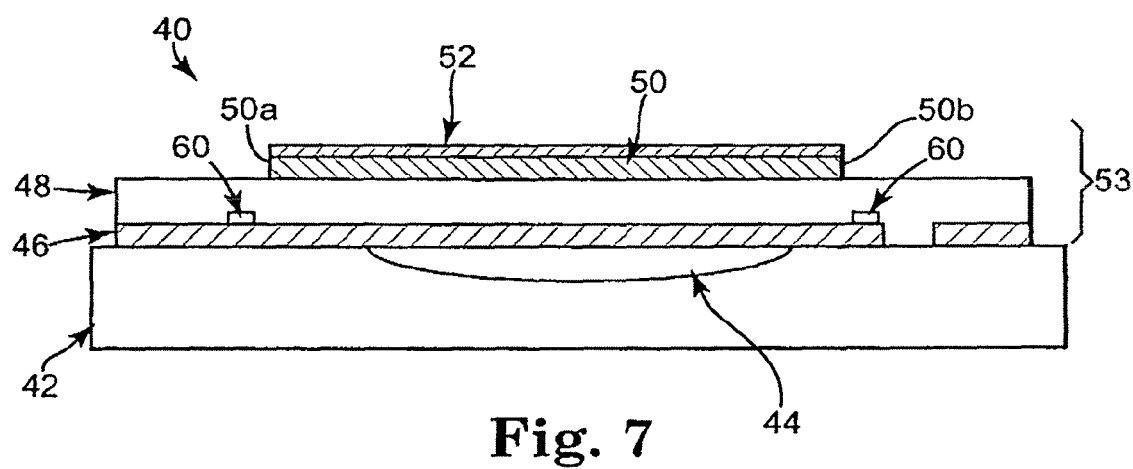
FIG. 7 illustrates a cross-sectional view of an FBAR according to one embodiment of the present invention.

FIG. 7 illustrates a cross-sectional view of FBAR 40 in accordance with an alternative embodiment of the present invention. FBAR 40 is essentially the same as that illustrated in FIG. 3, and includes substrate 42, depression 44, first electrode 46, piezoelectric (PZ) layer 48, second electrode 50, and passivation layer 52. First and second edges 50a and 50b of the perimeter of second electrode 50 are also illustrated. In addition, however, FBAR 40 illustrated in FIG. 7, has recessed feature 60 formed on a surface of PZ layer 48 that is opposite the surface in which recessed feature 60 was formed in FIG. 3. As FBAR 40 is depicted in FIG. 3, recessed feature 60 is on the "top" surface of PZ layer 48, whereas as FBAR 40 is depicted in FIG. 7, recessed feature 60 is on the "bottom" surface of PZ layer 48. As with recessed feature 60 depicted in FIG. 3, recessed feature 60 depicted in FIG. 7 is also outside first and second edges 50a and 50b of second electrode 50. The performance of FBAR 40 as illustrated in FIG. 7 may be the same as that described above for FBAR 40 as depicted in FIG. 3. Recessed feature 60 on the "bottom" surface of PZ layer 48 may be achieved in a variety of ways known by those skilled in the art, including but not limited to, a release of a sacrificial material.

Figure 8:
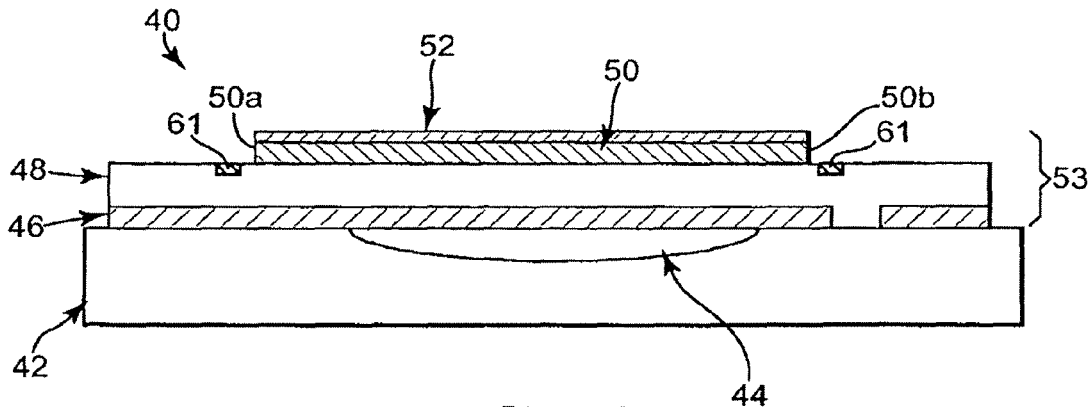
FIG. 8 is a cross-sectional view of an FBAR according to another embodiment of the present invention.

FIG. 8 illustrates a cross-sectional view of FBAR 40 in accordance with an alternative embodiment of the present invention. FBAR 40 is essentially the same as that illustrated in FIG. 3, and includes substrate 42, depression 44, first electrode 46, piezoelectric (PZ) layer 48, second electrode 50, and passivation layer 52. In addition, however, FBAR 40 illustrated in FIG. 8, has fill material 61 inserted in recessed feature 60, which were illustrated in FIG. 3. Fill material 61 inserted in recessed feature 60 can further improve the performance of FBAR 40, resulting in improved insertion loss and improved resonator quality factor Q of FBAR 40.

In one embodiment, fill material 61 is the same material as that used for second electrode 50. In that case, fill material 61 will have different dispersion characteristics than will the remaining material of PZ layer 48, which in one case is AlN. Adding this material with differing dispersion characteristics can improve insertion loss and improve the resonator quality factor Q of FBAR 40.

For example, fill material 61 can be made of Mo material just as first and second electrodes 46 and 50, or metal such as Pt, W, Cu, Al, or Ag. In alternative embodiments, fill material 61 could also be made of other materials, such as polyimide, BCB (benzocyclobutene), $SiO_2$, $Si_3N_4$, or other dielectrics, AlN, ZnO, $LiNbO_3$, PZT, $LiTaO_3$, $Al_2O_3$, or other piezoelectric materials.

Figure 9:
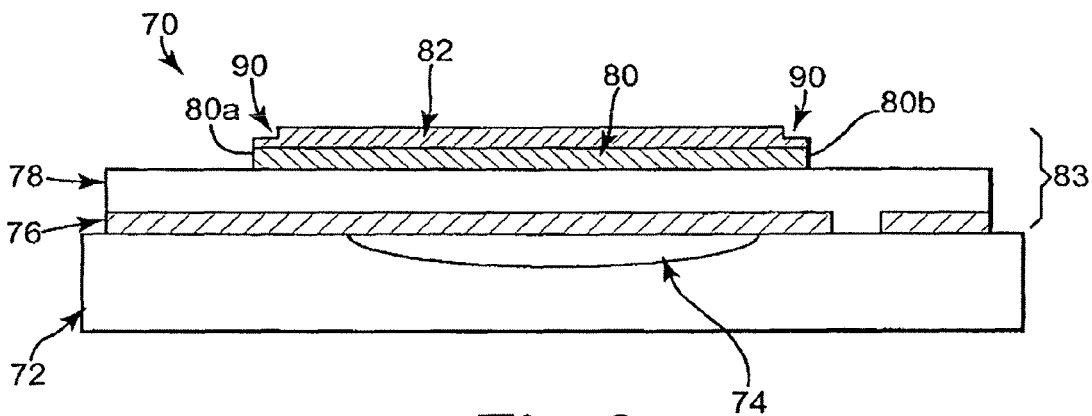
FIG. 9 is a cross-sectional view of an FBAR according to another embodiment of the present invention.

FIG. 9 illustrates FBAR 70 in accordance with an alternative embodiment of the present invention. FBAR 70 includes substrate 72, depression 74, first electrode 76, piezoelectric (PZ) layer 78, second electrode 80, and passivation layer 82. Typically, contacts (not illustrated in FIG. 9) are coupled to first and second electrodes 76 and electrode 80. The contacts facilitate connecting first and second electrodes 76 and 80 to a voltage source. First electrode 76, PZ layer 78, second electrode 80, and passivation layer 82 collectively form FBAR membrane 83, which may be placed over a depression 74 or over an acoustic mirror as discussed above. FBAR membrane 83 is illustrated adjacent substrate 72 and suspended over depression 74 to provide an electrode-air interface. As with previous embodiments, an electrode-acoustic mirror interface is also obtainable using an SMR design in accordance with the present invention.

First and second edges 80a and 80b of second electrode 80 are aligned in the horizontal direction relative to the edges of passivation layer 82. Adjacent these edges, recessed feature 90 is formed in passivation layer 82. Like recessed feature 60 described previously with respect to FBAR 40, recessed feature 90 improve the performance of FBAR 70, resulting in improved noise reduction and improved resonator quality factor Q of FBAR 70.

Figure 10:
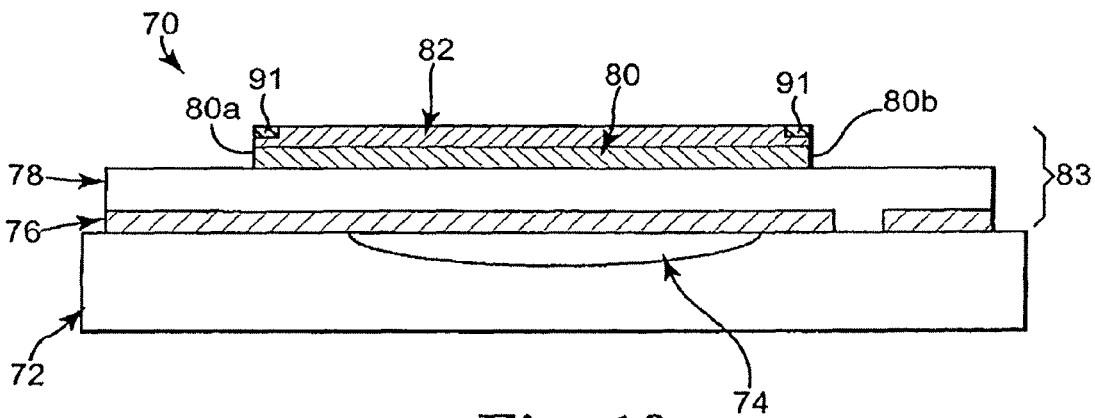
FIG. 10 is a cross-sectional view of an FBAR according to another embodiment of the present invention.

FIG. 10 illustrates a cross-sectional view of FBAR 70 in accordance with an alternative embodiment of the present invention. FBAR 70 is essentially the same as that illustrated in FIG. 9, and includes substrate 72, depression 74, first electrode 76, piezoelectric (PZ) layer 78, second electrode 80, and passivation layer 82. In addition, however, FBAR 70 illustrated in FIG. 10, has fill material 91 inserted in recessed feature 90, which is illustrated in FIG. 9. Fill material 91 inserted in recessed feature 90 can further improve the performance of FBAR 70, resulting in improved insertion loss and improved resonator quality factor Q of FBAR 70. In addition, fill material 91 inserted in recessed feature 90 of passivation layer 80 affect mass-loading of the resonator in local regions of FBAR 70. This in turn alters the resonant behavior in that local region. With the correct size and amount of material absent or present, the overall device performance can be altered.

In one embodiment, fill material 91 is that same material as that used for second electrode 80. In that case, fill material 91 will have different dispersion characteristics than will the remaining material of PZ layer 78, which in one case is AlN. Adding this material with differing dispersion characteristics can improve insertion loss and improve the resonator quality factor Q of FBAR 70. For example, fill material 91 can be made of Mo material just as first and second electrodes 76 and 80, or any metal such as Pt, W, Cu, Al, Au, or Ag. In alternative embodiments, fill material 91 could also be made of other materials, such as polyimide, BCB, $SiO_2$, $Si_3N_4$, or other dielectrics, AlN, ZnO, $LiNbO_3$, PZT, $LiTaO_3$, $Al_2O_3$, or other piezoelectric materials.

The process for fabricating FBARs 40 and 70 may be accomplished in a variety of ways consistent with the present inventions. In one embodiment, FBAR 40 or 70 is built with a standard flow up to a regular field etch step, the FBAR is masked for the etch feature, then etched, then the resist mask is stripped away and then the regular field etch is finalized. In this case, field etch refers to etch of the main piezoelectric layer.

In another embodiment, FBAR 40 or 70 is built with a standard flow up to a regular field etch step, the FBAR is masked for the etch feature, then etched, then the resist mask is stripped away. Then a pattern lift-off mask is put down, the fill material is deposited in the etch feature, the lift-off mask is stripped and then the regular field etch is finalized.

In another embodiment, FBAR 40 or 70 is built with a standard flow up to a regular field etch step, the FBAR is masked for the etch feature, then etched, then the resist mask is stripped away. Then fill material is deposited in the etch feature, a etch mask for the fill material is put down, the fill material is etched, the etch mask is stripped, and then the regular field etch is finalized.

The recess in FBAR 70 can be made with an etch step, but can also be generated by a lift-off process. Furthermore, the recess in FBAR 70 can in some instances be made before the field etch.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An acoustic resonator comprising:
a substrate;
a first electrode adjacent the substrate;
a layer of piezoelectric material adjacent the first electrode;
a second electrode adjacent the layer of piezoelectric material;
a passivation layer adjacent the second electrode, wherein the passivation layer includes a recessed feature; and
fill material in the recessed feature of the passivation layer, wherein the fill material is not electrically connected to the acoustic resonator.

2. The acoustic resonator of claim 1 wherein the second electrode comprises a material that is the same as the fill material in the recessed feature.

3. The acoustic resonator of claim 1 wherein the fill material is a material selected from the group comprising dielectrics, metals, piezoelectrics, Mo, Pt, Al, Cu, W, Au, Ag, polyimide, BCB (benzocyclobutene), $SiO_2$, $Si_3N_4$, AlN, ZnO, $LiNbO_3$, PZT, $LiTaO_3$, or $Al_2O_3$.

4. The acoustic resonator of claim 1 wherein the recessed feature has a depth in the passivation layer that is on the order of ten to thousands of angstroms and a width on the order of fractions of a micron to microns.

5. An acoustic resonator comprising:
a substrate;
a first electrode adjacent the substrate;
a layer of piezoelectric material adjacent the first electrode;
a second electrode adjacent the layer of piezoelectric material;
a passivation layer adjacent the second electrode, wherein the passivation layer includes a recessed feature; and
fill material in the recessed feature of the passivation layer, wherein the recessed feature extends around a substantial portion of the perimeter of the passivation layer.

6. The acoustic resonator of claim 5, wherein the second electrode comprises a material that is the same as the fill material in the recessed feature.

7. The acoustic resonator of claim 5, wherein the fill material is a material selected from the group comprising dielectrics, metals, piezoelectrics, Mo, Pt, Al, Cu, W, Au, Ag, polyimide, BCB (benzocyclobutene), $SiO_2$, $Si_3N_4$, AlN, ZnO, $LiNbO_3$, PZT, $LiTaO_3$, or $Al_2O_3$.

8. The acoustic resonator of claim 5, wherein the recessed feature has a depth in the passivation layer that is on the order of ten to thousands of angstroms and a width on the order of fractions of a micron to microns.

* * * * *